US008097802B2

(12) United States Patent
Yang et al.

(10) Patent No.: US 8,097,802 B2
(45) Date of Patent: Jan. 17, 2012

(54) THERMOELECTRIC MATERIAL INCLUDING A MULTIPLE TRANSITION METAL-DOPED TYPE I CLATHRATE CRYSTAL STRUCTURE

(75) Inventors: Jihui Yang, Lakeshore (CA); Xun Shi, Troy, MI (US); Shengqiang Bai, Shanghai (CN); Wenqing Zhang, Shanghai (CN); Lidong Chen, Shanghai (CN); Jiong Yang, Shanghai (CN)

(73) Assignee: GM Global Technology Operations LLC, Detroit, MI (US)

( * ) Notice: Subject to any disclaimer, the term of this patent is extended or adjusted under 35 U.S.C. 154(b) by 342 days.

(21) Appl. No.: 12/434,333

(22) Filed: May 1, 2009

(65) Prior Publication Data

US 2010/0275963 A1     Nov. 4, 2010

(51) Int. Cl.
*H01L 35/12* (2006.01)
*H01L 35/00* (2006.01)
*H01B 1/02* (2006.01)
*H01L 35/30* (2006.01)

(52) U.S. Cl. ............... 136/236.1; 136/200; 136/205; 136/239; 252/518.1; 423/324

(58) Field of Classification Search ............... 136/236, 136/236.1
See application file for complete search history.

(56) References Cited

U.S. PATENT DOCUMENTS

| | | |
|---|---|---|
| 6,461,581 B1 | 10/2002 | Eguchi et al. |
| 6,797,199 B2 | 9/2004 | Eguchi et al. |
| 2008/0190475 A1 | 8/2008 | Kita |

OTHER PUBLICATIONS

N.L. Okamoto, K. Kishida, K. Tanaka, and H. Inui, "Crystal structur and thermoelectric properties of type-I clathrate compounds in the Ba-Ga-Ge system", Journal of Applied Physics, 2006, 100, 073504.*
S. Johnse, A. Bentien, G.K.H. Madsen, and B.B. Iversen, "Crstal Structure, Band Structure, and Physical Properties of Ba8Cu6-xGe40+x (0</=x</=0.7)" Chem. Mater. 2006, 18, 4633-4642.*
Anno, H., et al., "Effect of Transition Element Substitution on Thermoelectric Properties of Semiconductor Clathrate Compound", 22nd Int. Conf. on Thermoelectrics, 2003, pp. 121-126.
Saramat, A., et al., "Large thermoelectric figure of merit at high temperature in Czochralski-grown clathrate Ba8Ga16Ge30", J. Appl. Phys. 99, 2006, pp. 023708-1-5.

(Continued)

*Primary Examiner* — Alexa Neckel
*Assistant Examiner* — Marla D McConnell
(74) *Attorney, Agent, or Firm* — Dierker & Associates, P.C.

(57) ABSTRACT

A thermoelectric material includes a multiple transition metal-doped type I clathrate crystal structure having the formula $A_8TM_{y_1}^{1}TM_{y_2}^{2} \ldots TM_{y_n}^{n}M_zX_{46-y_1-y_2-\ldots-y_n-z}$. In the formula, A is selected from the group consisting of barium, strontium, and europium; X is selected from the group consisting of silicon, germanium, and tin; M is selected from the group consisting of aluminum, gallium, and indium; $TM^1$, $TM^2$, and $TM^n$ are independently selected from the group consisting of 3d, 4d, and 5d transition metals; and $y_1$, $y_2$, $y_n$ and Z are actual compositions of $TM^1$, $TM^2$, $TM^n$, and M, respectively. The actual compositions are based upon nominal compositions derived from the following equation: $z=8 \cdot q_A - |\Delta q_1|y_1 - |\Delta q_2|y_2 - \ldots - |\Delta q_n|y_n$, wherein $q_A$ is a charge state of A, and wherein $\Delta q_1$, $\Delta q_2$, $\Delta q_n$ are, respectively, the nominal charge state of the first, second, and n-th TM.

20 Claims, 6 Drawing Sheets

OTHER PUBLICATIONS

Goldsmid, H.J., et al., "Estimation of the Thermal Band Gap of a Semiconductor from Seebeck Measurements", Journal of Electronic Materials, vol. 28, No. 7, 1999, pp. 869-872.

Mahan, G. D., "Figure of merit for thermoelectrics", Journal of Applied Physics 65, 1989, pp. 1578-1583.

Martin, J., et al., "Optimization of the thermoelectric properties of Ba8Ga16Ge30", Applied Physics Letters 92, 2008, pp. 222110-1-3.

Matsui, T., et al, "Structure and properties of Ba8Ga16Ge30 clathrates by a novel synthesis method using CO gas reductive atmosphere", Journal of Alloys and Compounds 391, 2005, pp. 284-287.

Meisner, G.P., et al, "Structure and Lattice Thermal Conductivity of Fractionally Filled Skutterudites: Solid Solutions of Fully Filled and Unfilled End Members", Physical Review Letters, vol. 80, No. 16, 1998, pp. 3551-3554.

Singh, David J., et al., "Skutterudite antimonides: Quasilinear bands and unusual transport", Physical Review B, vol. 50, No. 15, 1994, pp. 11235-11238.

Yang, J., et al., "Strain field fluctuation effects on lattice thermal conductivity of ZrNiSn-based thermoelectric compounds" Applied Physics Letters, vol. 85, No. 7, 2004, pp. 1140-1142.

\* cited by examiner

THERMOELECTRIC MATERIAL INCLUDING A MULTIPLE TRANSITION METAL-DOPED TYPE I CLATHRATE CRYSTAL STRUCTURE

STATEMENT REGARDING FEDERALLY SPONSORED RESEARCH OR DEVELOPMENT

This invention was made in the course of research and/or development supported by the U.S. Department of Energy, under Government Contract No. DE-FC26-04NT42278. The U.S. government has certain rights in the invention.

TECHNICAL FIELD

The present disclosure relates generally to thermoelectric materials; and more particularly to thermoelectric materials including a multiple transition metal-doped type I clathrate crystal structure.

BACKGROUND

Thermoelectric materials including Type I clathrate structures may be used at least for power generation applications. Such structures may be suitable for such applications due, at least in part, to their low lattice thermal conductivity values. However, such structures may be unsuitable for intermediate temperature applications (e.g., between about 500 K and about 1000 K), at least because the maximum thermoelectric figure of merit, ZT, is generally less than 1 at about 1000 K.

SUMMARY

A thermoelectric material including a multiple transition metal-doped type I clathrate crystal structure having the formula $A_8 TM_{y_1}^1 TM_{y_2}^2 \ldots TM_{y_n}^n M_z X_{46-y_1-y_2-\ldots-y_n-z}$. In the formula, A is selected from the group consisting of barium, strontium, and europium; X is selected from the group consisting of silicon, germanium, and tin; M is selected from the group consisting of aluminum, gallium, and indium; $TM^1$, $TM^2$, and $TM^n$ are independently selected from the group consisting of 3d, 4d, and 5d transition metals; and $y_1$, $y_2$, $y_n$ and Z are actual compositions of $TM^1$, $TM^2$, $TM^n$, and M, respectively. The actual compositions are based upon nominal compositions derived from the following equation: $z = 8 \cdot q_A - |\Delta q_1| y_1 - |\Delta q_2| y_2 - \ldots - |\Delta q_n| y_n$, wherein $q_A$ is a charge state of A, and wherein $\Delta q_1, \Delta q_2, \Delta q_n$ are, respectively, the nominal charge state of the first, second, and n-th TM.

BRIEF DESCRIPTION OF THE DRAWINGS

Features and advantages of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Figure 1:
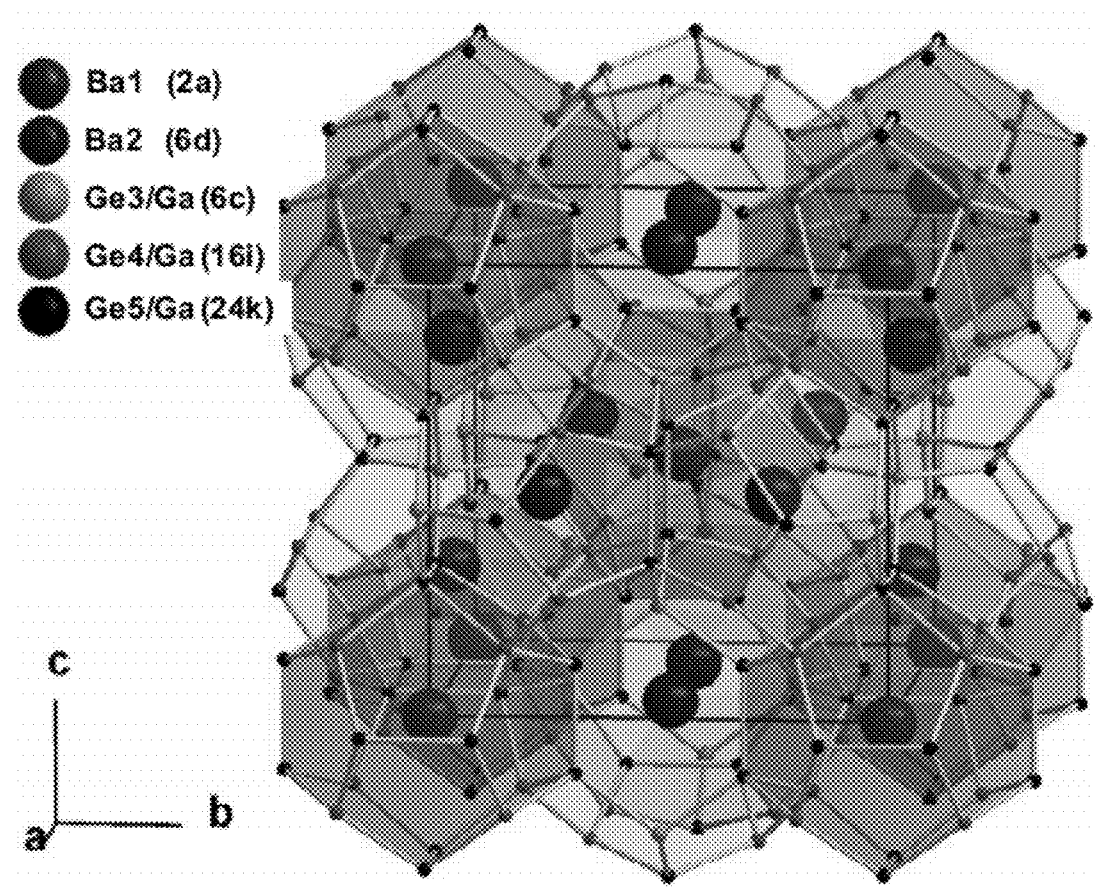
FIG. 1 is a schematic perspective representation of $Ba_8Ga_{16}Ge_{30}$ with two different types of polyhedral, the dodecahedtron (shown in brown) and the tetrakeidecahedtron (shown in blue)

The efficiency of a thermoelectric (TE) material is often characterized by a thermoelectric figure of merit, ZT. The figure of merit, ZT, is a dimensionless product and is defined by one of the following formulas:

$$ZT = \frac{S^2 T}{\rho \kappa} = \frac{S^2 T}{\rho(\kappa_L + \kappa_e)} \qquad \text{(Eqn. 1)}$$

where S, $\rho$, $\kappa$, $\kappa_L$, $\kappa_e$, and T are the Seebeck coefficient (or thermopower), electrical resistivity, total thermal conductivity, lattice thermal conductivity, electronic thermal conductivity, and absolute temperature, respectively; or $$ZT = S^2 \sigma T/\kappa \qquad \text{(Eqn. 2)}$$

where S, $\sigma$, $\kappa$, and T are the Seebeck coefficient (or thermopower), electrical conductivity, total thermal conductivity, and absolute temperature, respectively. An efficient thermoelectric material generally possesses a combination of a high Seebeck coefficient, a low electrical resistivity or high electric conductivity, and a low thermal conductivity, and, therefore, may be classified as a material having a suitably high figure of merit, ZT. To drive the figure of merit upwards, the thermoelectric material should be formed in a manner sufficient to i) enhance electrical conductivity, ii) enhance thermopower, and/or iii) decrease the thermal conductivity.

It is also believed that an efficient thermoelectric material should have a band-gap (Eg) of about 10 $k_B T_{op}$ (where $k_B$ is Boltzmann's constant and $T_{op}$ is the desirable operating temperature) so that the maximum ZT values fall within the desirable operating temperature range.

Type I clathrates are a class of TE materials having the general formula of $A_8 M_{16} X_{30}$ (where A=Sr, Ba, Eu; M=Al, Ga, In; and X=Si, Ge, Sn), which crystallize in the cubic space group Pm3n. Two different types of polyhedra may form the unit cell of the typical type I clathrate $Ba_8Ga_{16}Ge_{30}$ (shown in FIG. 1): the dodecahedron (12 pentagonal faces shown in brown) and the tetrakeidecahedron (12 pentagonal and 2 hexagonal faces shown in blue). Generally, there are a total of eight polyhedra per cubic unit cell, including two $Ge_{20}$ dodecahedra and six $Ge_{24}$ tetrakaidecahedra. The framework structure is formed by the tetrahedrally bonded network of Ge, and the $Ge_{20}$ dodecahedra are linked via interstitial 6c positions. The Ba atoms reside in both the $Ge_{20}$ and $Ge_{24}$ cages at the 2a and 6d positions, respectively. Known type I clathrates tend to have low thermal conductivity values, due, at least in part to the static and dynamic disorder of the guest atom A inside the cages.

The present inventors have recognized that the carrier concentration of the nominally undoped and doped type I clathrates is typically on the order of $10^{20}$ cm$^{-3}$, and believe this carrier concentration substantially inhibits the ease of improving the power factor ($S^2\sigma$) of such materials. However, the present inventors have found that doping the type I clathrate with multiple transition metals results in thermoelectric materials that exhibit a significantly improved ZT between 500 K and 1000 K, and have tunable bandgaps $E_g$. The transition metal doping introduces charge distortion and lattice defects into the clathrate materials, which in turn increase the ionized impurity scattering of carriers and point defect scattering of lattice phonons, respectively. The introduction of charge distortion and lattice defects contributes to enhanced thermopower S and reduced lattice thermal conductivity ($\kappa_L$), both of which enhance the figure of merit, ZT (which, in some embodiments, is up to about 2.0 between 500 K and 1000 K). The band gap of the materials disclosed herein may be tuned between 0.1 eV and 0.5 eV by adjusting the transition metal content. As such, the materials disclosed herein are specifically configured type I clathrates with desirable thermoelectric properties between 500 K and 1000 K.

In typical type I clathrates, such as that shown in FIG. 1, the neighboring framework atoms (Ge or Ga) are covalently bonded via sp$^3$ hybridization. The Ba atoms act as electron donors and fill the sp$^3$ bonding orbitals of the electron deficient Ga. The Zintl-Klemm rule (i.e., the charge balance rule) holds for Ga-doped type I clathrates, where the total number of electrons (16) donated by the Ba atoms (nominally +2) is balanced by that of Ga (nominally −1) in a unit cell.

The type I clathrate material disclosed herein is doped with two or more transition metals, and has the general formula of:

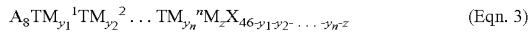

$$A_8TM_{y_1}^1TM_{y_2}^2\ldots TM_{y_n}^n M_z X_{46-y_1-y_2-\ldots-y_n-z} \quad \text{(Eqn. 3)}$$

where A is selected from the group consisting of barium, strontium, and europium; X is selected from the group consisting of silicon, germanium, and tin; M is selected from the group consisting of aluminum, gallium, and indium; TM$^1$, TM$^2$, and TM$^n$ are independently selected from the group consisting of 3d, 4d, and 5d transition metals; and $y_1$, $y_2$, $y_n$ and Z are compositions of TM$^1$, TM$^2$, TM$^n$, and M, respectively. When doped with transition metals, some of the atoms in the framework of Ge atoms are replaced by the transition metals. In one non-limiting example, the type I clathrate material has the composition of $Ba_8Ni_{0.31}Zn_{0.52}Ga_{13.06}Ge_{32.2}$.

Figure 2:
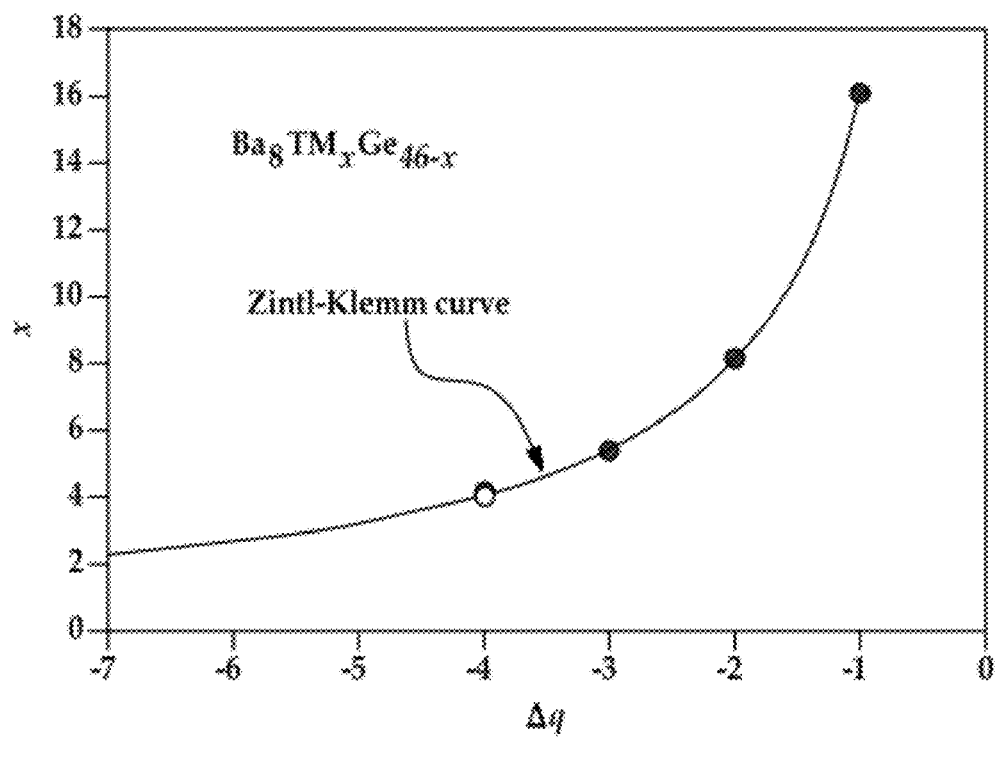
FIG. 2 is a graph illustrating the transition metal (TM) content x versus its nominal charge state $\Delta q$ (i.e., the difference between the valence electron count of the transition metal and that of Ge) for $Ba_8 TM_x Ge_{46-x}$ (TM=Ni, Cu, Zn or Ga), where the solid line is the Zintl-Klemm rule, $x=16/|\Delta q|$.

Referring now to FIG. 2, the present inventors have found that the previously mentioned Zintl-Klemm rule may be used to determine the nominal composition of each of the transition metals (TM) and M in transition metal doped type I clathrates, and thus, that the Zintl-Klemm rule may be used to design a desirable transition metal doped type I clathrate. The nominal composition may then be used to synthesize the clathrate.

In making this determination, the present inventors synthesized transition metal doped type I clathrate solid solution samples by a combination of arc melting, induction melting, and long-term high temperature annealing. It is to be understood that any other suitable method may be used to generate the multi-transition metal-doped type I clathrate materials disclosed herein. The metals used successfully were nickel, copper, zinc, and gallium. The Cu and Ni-doped samples were consolidated by spark plasma sintering, while the Zn- and Ga-doped ones were consolidated by hot pressing. X-ray power diffraction was used to conform that all of the samples had the type I clathrate structure. The actual compositions of the components were determined by the electron probe microanalysis (EPMA) averaged over 12 randomly selected locations. The results of this analysis are shown in FIG. 2. In particular, FIG. 2 illustrates, for type I clathrates ($Ba_8TM_xGe_{46-x}$), the transition metal content x on the Y-axis and its nominal charge state $\Delta q$ (i.e., the difference between the metal's valence electron count and that of Ge) on the X-axis. The data illustrated in FIG. 2 corresponds with two clathrate structure samples including Ni as the transition metals (TM), one clathrate structure sample including Cu as the transition metal (TM), one clathrate structure sample including Zn as the transition metal (TM), and one clathrate structure sample including Ga as the transition metal (TM). The starting composition (i.e., the compositions used to determine the starting amount of each element for the respective samples of the clathrate material) and actual compositions for each of the samples (except for the sample containing Ga) are shown below in Table I.

From the data shown in FIG. 2, the present inventors concluded that the Zintl-Klemm rule ($x=16/|\Delta q|$) is valid in predicting the compositions of TM-doped type I clathrates. For example, the charge of copper has three less electrons than that of germanium, and thus the charge state of copper is −3. Plugging the charge state of copper into the Zintl-Klemm equation results in $x=16/|-3|=5.3$. The electron probe microanalysis data of FIG. 2 indicates that the amount of copper (5.29) actually present in the material corresponds with the calculated amount of 5.3. It is to be understood that in type I clathrates, vacancies and/or defects may exist on the Ga/Ge sites. As such, a slight difference between the nominal composition (predicted by the Zintl-Klemm rule) and the actual composition is likely to exist. Such vacancies and/or defects explain the fact that the actual compositions of the transition metals, M, and X may not be exactly equal to 46.

Such predictions render it possible to determine the proper nominal compositions for the type I clathrate structures doped with multiple transition metals. Referring back to Equation 3 above, z may be calculated using the following equation:

$$z=8\cdot q_A-|\Delta q_1|y_1-|\Delta q_2|y_2-\ldots-|q_n|y_n \quad \text{(Eqn. 4)}$$

where $q_A$ is a charge state of A, and $\Delta q_1$, $\Delta q_2$, $\Delta q_n$ are, respectively, the nominal charge states of the first, second, and n-th transition metals used to dope the type I clathrate material. In a non-limiting example, when barium is selected for "A", the charge state $q_A+2$, and when Ni and Zn are selected as the doping transition metals, the nominal charge states are −4, and −2, respectively. Plugging such numbers into Equation 4 results in $z=8(2)-4y_1-2y_2$. Any numbers or fractions satisfying this equation may be selected for z, $y_1$, and $y_2$.

As discussed above, the type I clathrate structures disclosed herein may be doped with nickel, zinc, copper, and/or combinations thereof. Other 3d transition metals (e.g., Mn, Co, or Fe) are believed to be suitable for doping the type I clathrates disclosed herein. Furthermore, it is believed that various combinations of 4d transition metals (e.g., ruthenium, rhodium, palladium, silver, cadmium, indium, etc.) and 5d transition metals (e.g., platinum, gold, mercury, thallium, etc.) may also be included in the type I clathrates disclosed herein.

The transition metal doped type I clathrate materials disclosed herein are narrow band gap semiconductors. The $E_g$ for the materials may be estimated using the maximum values of thermopower ($S_{max}$) and the temperature ($T_{max}$):

$$E_g = 2eS_{max}T_{max} \qquad \text{(Eqn. 5)}$$

where e is the electron charge. The estimated $E_g$ data for some of the materials formed and tested to obtain the data shown in FIG. 2 are listed in Table I, together with other room temperature transport properties measured for such materials. These $E_g$ are believed to be too small to render the materials as efficient thermoelectric materials for operating temperatures greater than 600 K.

metal-doped type I clathrate crystal structure thermoelectric material (identified by reference numeral 1604). The power generator 1600 includes a hot side (identified by a plate 1608), which is in contact with a heat source of high temperature $T_h$. The power generator 1600 further includes a cold side (identified by a plate 1602), which is in contact with a heat sink of low temperature $T_c$, where $T_c$ is lower than $T_h$. A temperature gradient formed between the plate 1608 (i.e., the hot side) and the plate 1602 (i.e., the cold side) causes electrons in the thermoelectric materials 1604, 1606 to move away from the plate 1608 at the hot side and towards the plate 1602 at the cold side, thereby generating an electric current. Power generation may, for example, be increased by increasing the temperature difference between the hot plate 1608 and the cold plate 1602 and by using the examples of the multiple transition metal-doped type I clathrate crystal structure thermoelectric material disclosed hereinabove, where such materials exhibit the desirably higher figure of merit, ZT, value.

To further illustrate embodiment(s) of the present disclosure, the following example is given herein. It is to be under-

TABLE I

Starting and actual compositions as determined by EPMA, room temperature values of: thermal conductivity (κ), electrical resistivity (ρ), thermopower (S), carrier concentration/density, mobility ($\mu_H$), and band gap ($E_g$) for transition metal doped clathrates

| Starting composition | Actual composition | κ (W/m-K) | ρ (ohm m) | S (μV/K) | carrier density (cm$^{-3}$) | $\mu_H$ (cm$^2$/V-s) | $E_g$ (eV) |
|---|---|---|---|---|---|---|---|
| $Ba_8Ni_6Ge_{40}$ | $Ba_8Ni_{4.10}Ge_{42.07}$ | 1.7 | $2.32 \times 10^{-5}$ | −101 | $-5.03 \times 10^{20}$ | 5.35 | 0.11 |
| $Ba_8Ni_4Ge_{42}$ | $Ba_8Ni_{3.96}Ge_{41.46}$ | 1.5 | $4.75 \times 10^{-5}$ | −110 | $-2.38 \times 10^{20}$ | 5.52 | 0.12 |
| $Ba_8Ni_8Ge_{38}$ | $Ba_8Ni_{3.91}Ge_{41.10}$ | | | | | | |
| $Ba_8Cu_{5.33}Ge_{40.67}$ | $Ba_8Cu_{5.29}Ge_{39.83}$ | 1.4 | $1.61 \times 10^{-3}$ | 252 | $7.22 \times 10^{18}$ | 5.37 | 0.15 |
| $Ba_8Zn_8Ge_{38}$ | $Ba_8Zn_{8.04}Ge_{38.41}$ | 1.4 | $2.64 \times 10^{-5}$ | −85 | $-2.72 \times 10^{20}$ | 8.69 | 0.34 |

The $E_g$ for $Ba_8Ga_{16}Ge_{30}$ (about 0.5 eV) is significantly higher than the transition doped clathrates shown in FIG. 1. The present inventors have found that the band gaps of the transition metal doped clathrates may be adjusted by forming type I clathrate solid solutions (e.g., formed via arc melting, induction melting, and annealing) having component compositions between those listed in Table I and $Ba_8Ga_{16}Ge_{30}$. The solid solution approach used to form the materials disclosed herein also results in a further reduction of the total thermal conductivity, thereby improving the ZT of the materials.

It is further believed that the addition of transition metals to the base $Ba_8Ga_{16}Ge_{30}$ type I clathrate crystal structure also alters the charge distribution of the resulting material. As discussed further in the Example hereinbelow, the relative strength of ionized impurity scattering increases with an increase in the transition metal content (i.e., an increased amount of transition metal(s) alloying on the Ga sites of the $Ba_8Ga_{16}Ge_{30}$ type I clathrate crystal structure). As such, it is believed that enhanced thermopower and power factor may be achieved via the transition metal-doped type I clathrate crystal structures disclosed herein.

Figure 9:
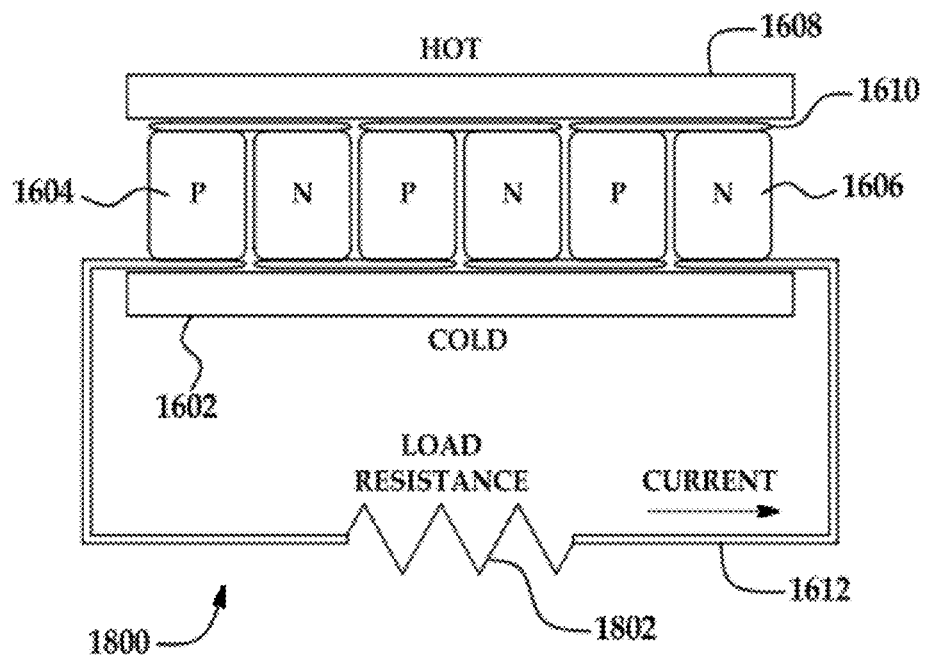
FIG. 9 is a schematic view of a thermoelectric power generator including an embodiment of the thermoelectric material including a multiple transition metal-doped type I clathrate crystal structure.

The several examples of the multiple transition metal-doped type I clathrate crystal structure thermoelectric material disclosed hereinabove may be used to make a variety of thermoelectric devices, an example of which is shown in FIG. 9. FIG. 9 depicts a thermoelectric power generator 1600 including an n-type multiple transition metal-doped type I clathrate crystal structure thermoelectric material (identified by reference numeral 1606) and a p-type multiple transition stood that this is provided for illustrative purposes and is not to be construed as limiting the scope of the disclosed example(s).

EXAMPLE

As mentioned hereinabove, transition metal (i.e., Cu, Ni, Zn, and Ga)-doped type I clathrate solid solution samples were synthesized by a combination of arc melting, induction melting, and long-term high temperature annealing. The compositions selected for the various transition metals were determined based upon the Zintl-Klemm rule, as described above. The Cu and Ni-doped samples were consolidated by spark plasma sintering, and the Zn- and Ga-doped samples were consolidated by hot pressing. As previously mentioned, the actual compositions in the resulting materials were determined by the electron probe microanalysis averaged over 12 randomly selected locations (the results of which are shown in FIG. 2).

Other samples, including multiple transition metals (e.g., combinations of Ni, Cu or Zn with Ga, and combinations of Ni and Zn with Ga) were also generated using the previously described method. When making these samples, the nominal compositions were calculated using the Zintl-Klemm rule, and such compositions were used to determine the amounts of each of the materials used.

Figure 3:
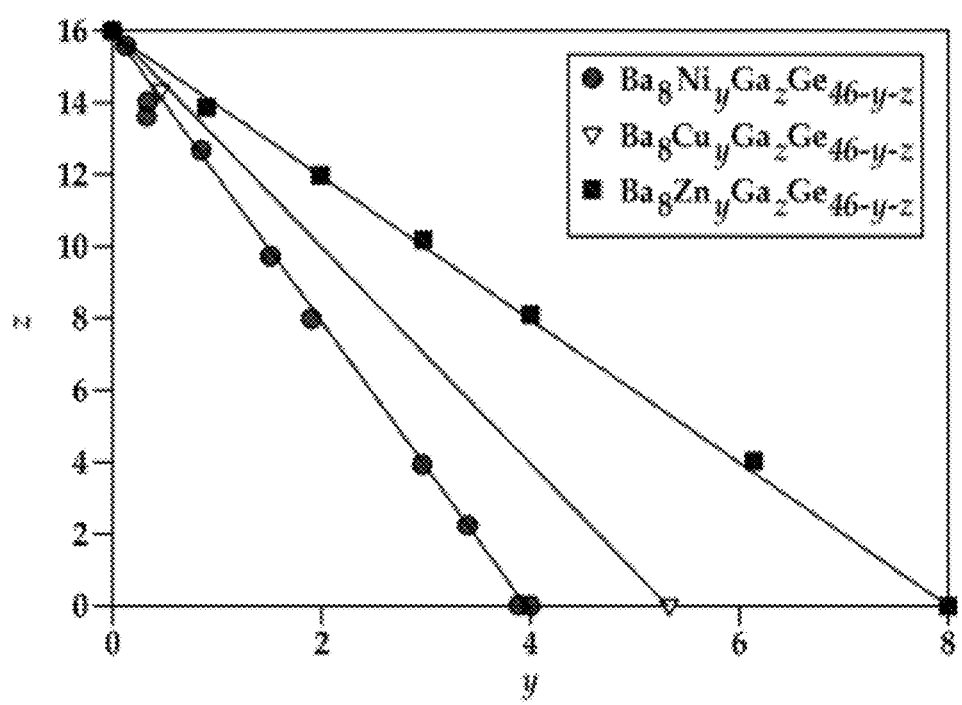
FIG. 3 is a graph depicting the relation between y and z for type I clathrate solid solutions $Ba_8 TM_y Ga_z Ge_{46-y-z}$ (where the solid lines represent the Zintl-Klemm rule, $z=16-|\Delta q|y$)

FIG. 3 illustrates the relationship between y and z for type I clathrate solid solutions having the general formula $Ba_8TM_yGa_zGe_{46-y-z}$. The actual compositions of the various samples were determined using electron probe microanalysis. The solid lines represent the Zintl-Klemm rule $z=16-|\Delta q|y$. These results further support the inventors' conclusion that the Zintl-Klemm rule is valid for determining and designing the compositions of type I clathrate solid solutions.

Figure 4:
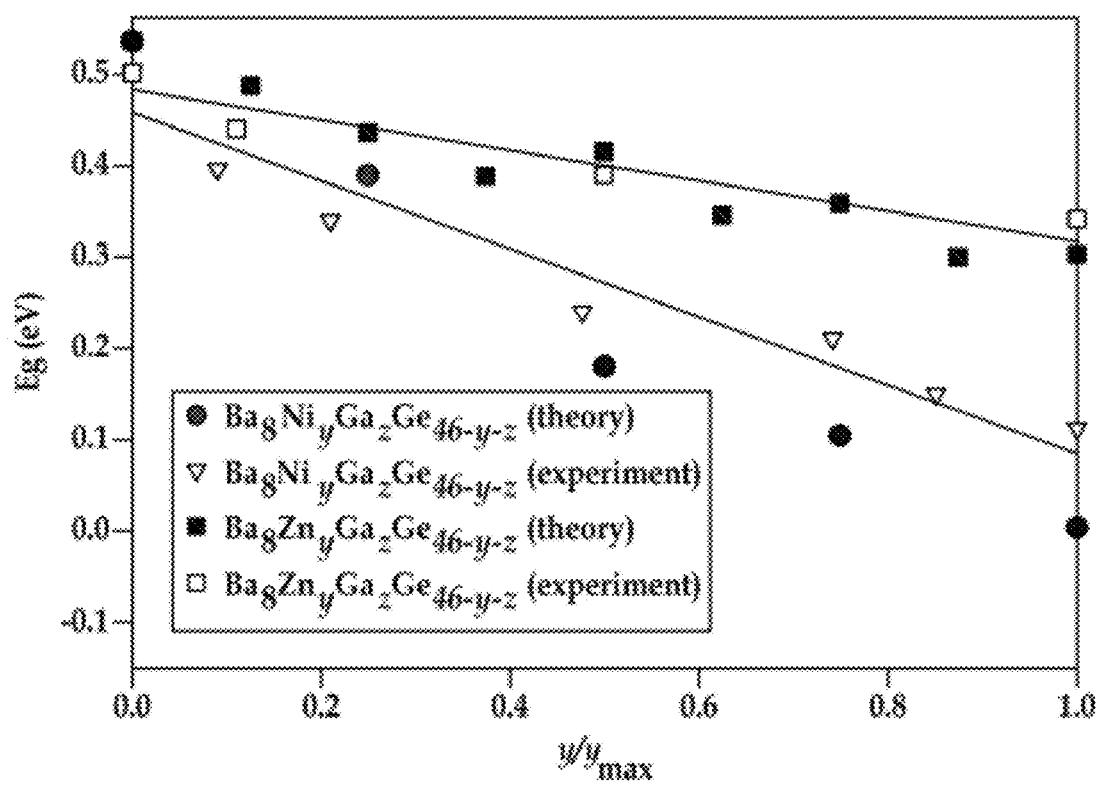
FIG. 4 is a graph depicting both theoretical and experimental data for the $E_g$ of $Ba_8 Ni_y Ga_z Ge_{46-y-z}$ and $Ba_8 Zn_y Ga_z Ge_{46-y-z}$ versus $y/y_{max}$ (where the solid lines are included for guiding the reader's eye)

Furthermore, the $E_g$ of these particular solid solutions ($Ba_8TM_yGa_zGe_{46-y-z}$) can be tuned approximately linearly between $Ba_8TM_xGe_{46-x}$ and $Ba_8Ga_{16}Ge_{30}$. The $E_g$ of the $Ba_8Ni_yGa_zGe_{46-y-z}$ and $Ba_8Zn_yGa_zGe_{46-y-z}$ samples are shown in FIG. 4. Furthermore, theoretical results, obtained via ab initio simulations, for such samples are also shown in FIG. 4, and these results are comparable with the obtained experimental data. It is also believed that the $E_g$ of other similar solid solutions (e.g., those including more than one TM) can also be tuned approximately linearly between $Ba_8TM_xGe_{46-x}$ and $Ba_8Ga_{16}Ge_{30}$.

Ab initio calculations were carried out using the projector augmented wave (PAW) method which is implemented in a Vienna ab initio package (VASP). Perdew-Burke-Ernzerhof generalized gradient approximation was adopted for exchange-correlation potential. The cutoff energy of plane wave basis was set to 300 eV, and an energy convergence criterion of $10^{-8}$ eV for self-consistency was used throughout the calculations. The k meshes for energy calculations were $4\times4\times4$ in the Monkhorst-Pack scheme, and denser k meshes were used for electronic structure calculations.

Figure 5:
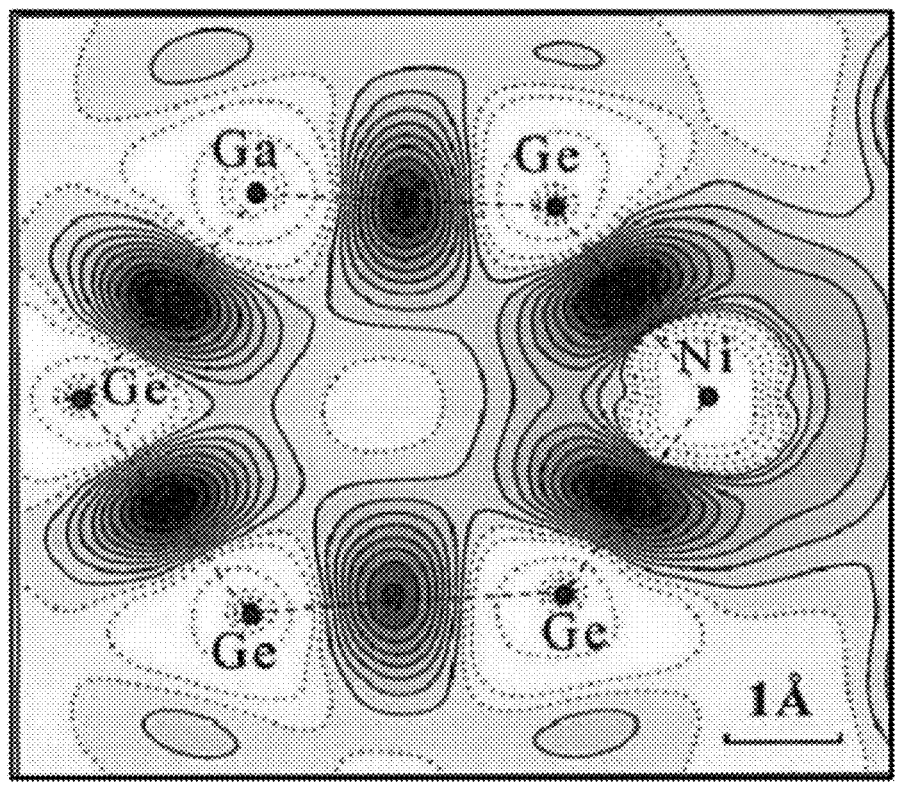
FIG. 5 is a schematic depiction of an electron-density contour plot for a plane containing Ga, Ni, and Ge atoms for $Ba_8 Ni_y Ga_z Ge_{46-y-z}$.

The addition of the transition metal to the base $Ba_8Ga_{16}Ge_{30}$ structure also affects the charge distribution of the structure. FIG. 5 is a schematic depiction of the electron-density difference contour plot for the plane containing Ga, Ni, and Ge atoms for $Ba_8Ni_yGa_zGe_{46-y-z}$. Electron accumulation is denoted by the relatively dark areas with solid lines, and electron depletion is denoted by the light areas with dashed lines. The solid black points in FIG. 5 indicate the positions of atoms. In the contour plot for this clathrate (i.e., $Ba_8Ni_yGa_zGe_{46-y-z}$), a strong charge distortion is observed around the Ni atoms. It is believed that the introduction of the transition metal induced the charge distortion, which in turn leads to significant ionized impurity scattering of electrons in the material.

Figure 6A:
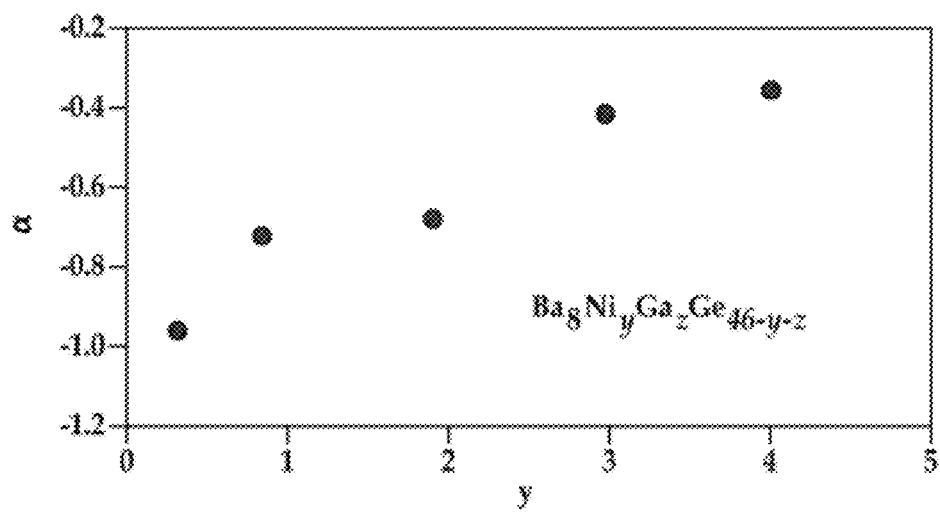
FIGS. 6A through 6C are graphs depicting A) room temperature carrier scattering parameter a as a function of y for $Ba_8 Ni_y Ga_z Ge_{46-y-z}$, B) room temperature thermopower as a function of electron density for $Ba_8 Ni_y Ga_z Ge_{46-y-z}$ (where the solid line represents a relation of $S \propto n^{-1/3}$), and C) temperature dependence of power factor $S^2\sigma$ for $Ba8 Ni_y Ga_z Ge_{46-y-z}$.

To investigate the effects of the charge distortions, the temperature dependence of electron mobility ($\mu_H$) was measured. Near room temperature, $\mu_H \propto T^\alpha$ for electron-phonon interaction and electron-ionized impurity interaction, with $\alpha=-1.5$ and 1.5, respectively. For the base $Ba_8Ga_{16}Ge_{30}$ structure, it is expected that $\alpha=-1.5$ near room temperature. This is indicative of the dominant electron-phonon scattering in such materials. However, as shown in FIG. 6A, as the Ni content increases in $Ba_8Ni_yGa_zGe_{46-y-z}$, the value of $\alpha$ increases. This data, in combination with the electron-density difference contour plot of FIG. 5, support the notion of mixed electron-phonon and ionized impurity scattering of the electrons in $Ba_8Ni_yGa_zGe_{46-y-z}$.

Figure 6B:
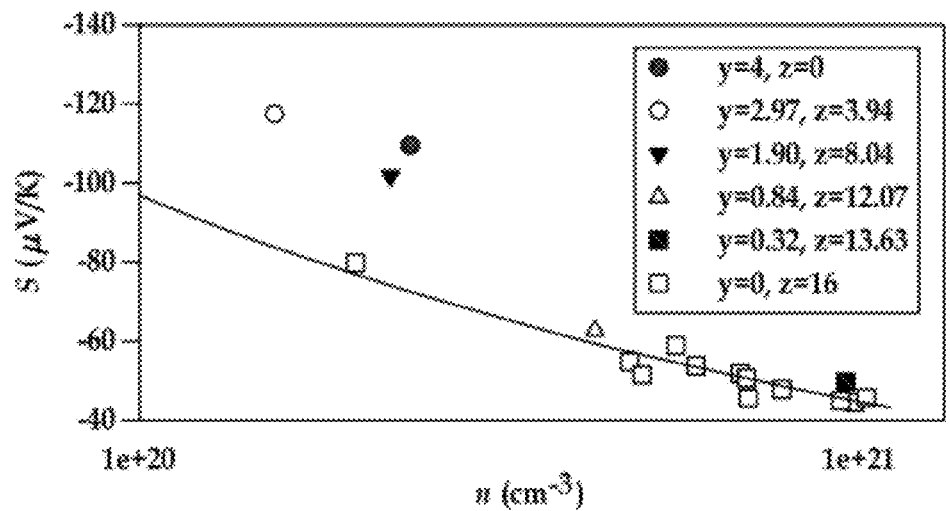
Figure 6C:
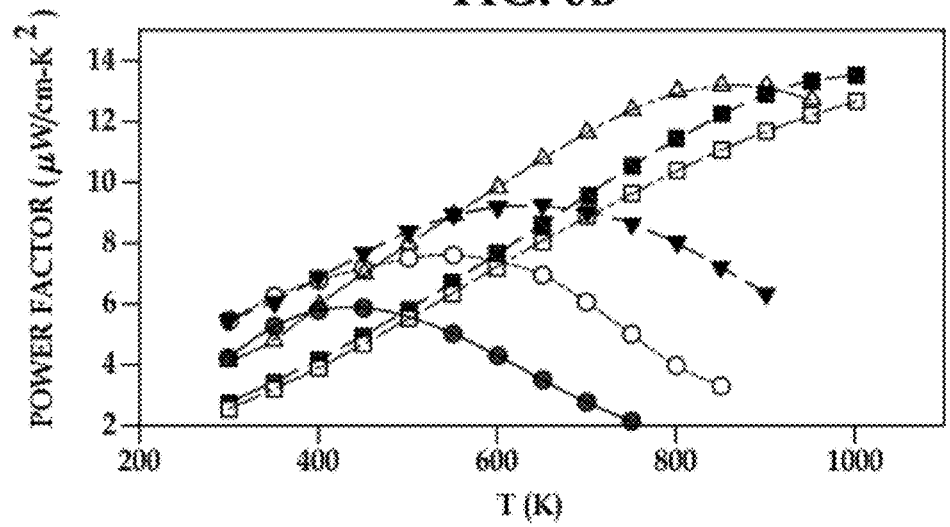

The relative strength of ionized impurity scattering increases with increasing Ni content, thereby enhancing thermopower and power factor of such samples as compared to the base $Ba_8Ga_{16}Ge_{30}$ structure (see, e.g., FIGS. 6B and 6C). It is to be understood that the data for the base $Ba_8Ga_{16}Ge_{30}$ structure was retrieved from Wang, et al., "Optimization of the thermoelectric properties of $Ba_8Ga_{16}Ge_{30}$." *Appl. Phys. Lett.* 92, 222110 (2008) and Hokazono, et al., "Effect of transition element substitution on thermoelectric properties of semiconductor clathrate compounds." *Proceeding of the 22nd International Conference on Thermoelectrics* (IEEE, Piscataway, N.J., 2003), pp. 121-126, while the data for the Ni containing samples was measured.

The carrier concentration range of the samples is shown in FIG. 6B. In this graph, the electronic dispersion of the clathrates is almost linear. For a degenerate semiconductor with linear electronic dispersion, the thermopower can be approximately written as $$S \propto (r+3/2)n^{-1/3} \qquad \text{(Eqn. 6)}$$

where the carrier scattering relaxation time power law parameter $r=-0.5$ and 1.5 for electron scattering by phonons and ionized impurities, respectively, and n is the carrier concentration. The S versus n data shown in FIG. 6B for the base $Ba_8Ga_{16}Ge_{30}$ structure and the $Ba_8Ni_yGa_zGe_{46-y-z}$ samples with lower Ni concentration do follow the $S \propto n^{-1/3}$ relation, however, the data for the base $Ba_8Ga_{16}Ge_{30}$ structure and the $Ba_8Ni_yGa_zGe_{46-y-z}$ samples with higher Ni concentrations have significantly higher S values (with an approximate 50% increase). Using Equation 6, at a given carrier concentration, it is believed that S will increase with increasing strength of the ionized impurity scattering. Based on these results, the present inventors have deduced that the enhanced S and $S^2\sigma$ for the $Ba_8Ni_yGa_zGe_{46-y-z}$ samples is a result of the increased strength of the ionized impurity scattering upon Ni alloying on the Ga sites. The ionized impurity scattering enhancement of S and $S^2\sigma$ discovered in these examples is unique because the role of very sharp localized electronic density of states in such enhancement is minimal or non-existent.

FIG. 6C (the key for which is shown in FIG. 6B) illustrates the power factor peak of $Ba_8Ni_yGa_zGe_{46-y-z}$ and for the base $Ba_8Ga_{16}Ge_{30}$ structure. The power factor peak results of the Ni-doped clathrates were measured, while the base structure information was obtained from the literature. The results illustrate that the power factor peak may be tuned between 400 K and 1000 K by adjusting the Ni content and hence $E_g$. These results also illustrate the flexibility that the transition metals add to the clathrate structure. More particularly, by tuning the transition metal composition, the TE properties of the resulting materials may be tuned according to the temperature range of the desirable application. As shown in FIG. 6C, the power factors near room temperature of the type I clathrates have been enhanced more than 200% (when compared to the base structure) by the transition metal doping, and the effect persists continuously into higher temperatures.

The calculated lattice thermal conductivity ($\kappa_L$) of $Ba_8Ni_yGa_zGe_{46-y-z}$ was also lower than that of the base $Ba_8Ga_{16}Ge_{30}$ structure, which is consistent with additional point defect scattering on the Ga site upon Ni doping. The lattice thermal conductivity in a solid solution is given evidenced by the following equation:

$$\kappa_L = \frac{k_B}{\left[4\pi v_s (ACT)^{\frac{1}{2}}\right]} \qquad \text{(Eqn. 7)}$$

where CT is the relaxation time for phonon-phonon scattering (C is a constant and T is the temperature), $v_s$ is the mean sound velocity (3046 m/s), A is the coefficient for the Rayleigh-type point defect scattering rate, and $k_B$ is the Boltzmann constant. It was assumed that the base $Ba_8Ga_{16}Ge_{30}$ structure is a pure system, and thus CT at high temperatures can be determined by $$k_{pure} = k_B^2 \theta_D / (2\pi^2 v_s \hbar CT) \qquad \text{(Eqn. 8)}$$

where $\theta_D$ is the Debye temperature (301 K). A is given by $$A = \Omega_0 \Gamma / (4\pi v_s^3) \qquad \text{(Eqn. 9)}$$

where $\Omega_0$ is the unit cell volume and $\Gamma$ is the scattering parameter.

The transition metal-doped $Ba_8Ga_{16}Ge_{30}$ clathrates were solid solutions of doped with nickel, zinc, or nickel and zinc. For a quaternary compound $U_uV_vW_wR_r$, the $\Gamma(UVWR)$ is given by $$\Gamma(UuVvWwRr) = \frac{u\left(\frac{M_U}{M_m}\right)^2\Gamma(U) + v\left(\frac{M_V}{M_m}\right)^2\Gamma(V) + w\left(\frac{M_W}{M_m}\right)^2\Gamma(W) + r\left(\frac{M_R}{M_m}\right)^2\Gamma(R)}{u+v+w+r} \quad \text{(Eqn. 10)}$$

where $M_m=(uM_U+vM_V+wM_W+rM_R)/(u+v+w+r)$. For the transition metal-doped $Ba_8Ga_{16}Ge_{30}$ clathrates, $U=Ba$, $V=(TM, Ga)$, $W=(Ge, Ga)$, and $R=Ge$. For an impurity atom with a concentration of $\alpha$, the scattering parameter is given by $$\Gamma=\alpha(1-\alpha)(\Delta M/M_{av})^2 \quad \text{(Eqn. 11)}$$

with $\Delta M = M_i - M_h$ and $M_{av} = \alpha M_i + (1-\alpha)M_h$, where $M_i$ and $M_h$ are the masses of the impurity and host atoms, respectively.

Figure 7A:
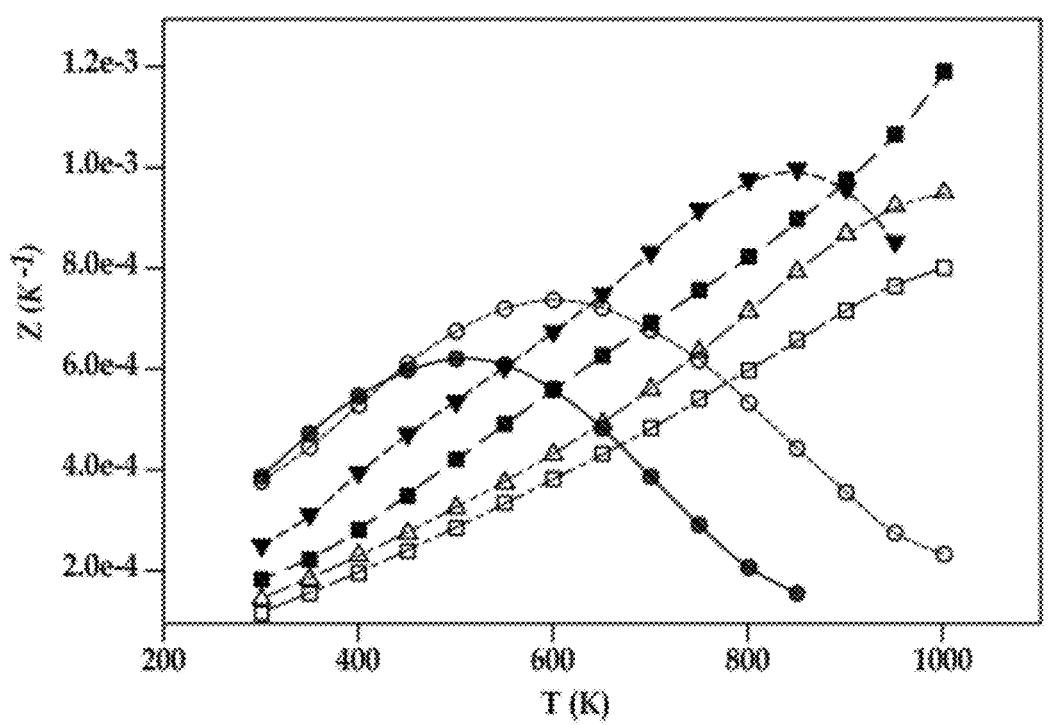
FIGS. 7A and 7B are graphs depicting the temperature dependence of Z (FIG. 7A) and ZT (FIG. 7B) for different transition metal (TM)-doped $Ba_8 Ga_{16} Ge_{30}$.
Figure 7B:
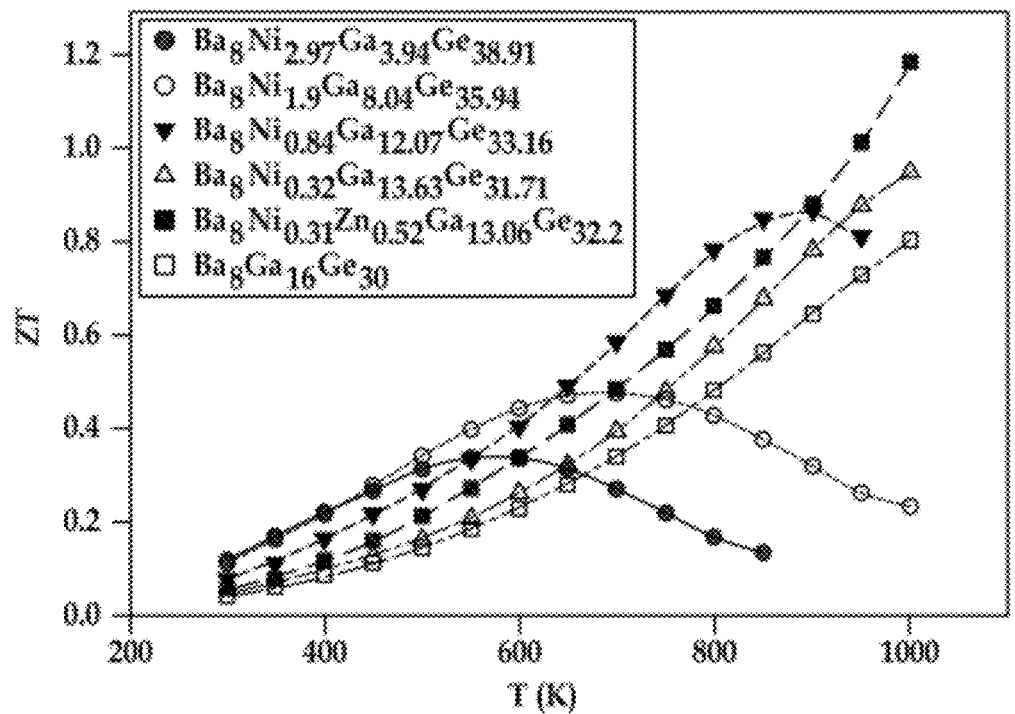
Figure 8:
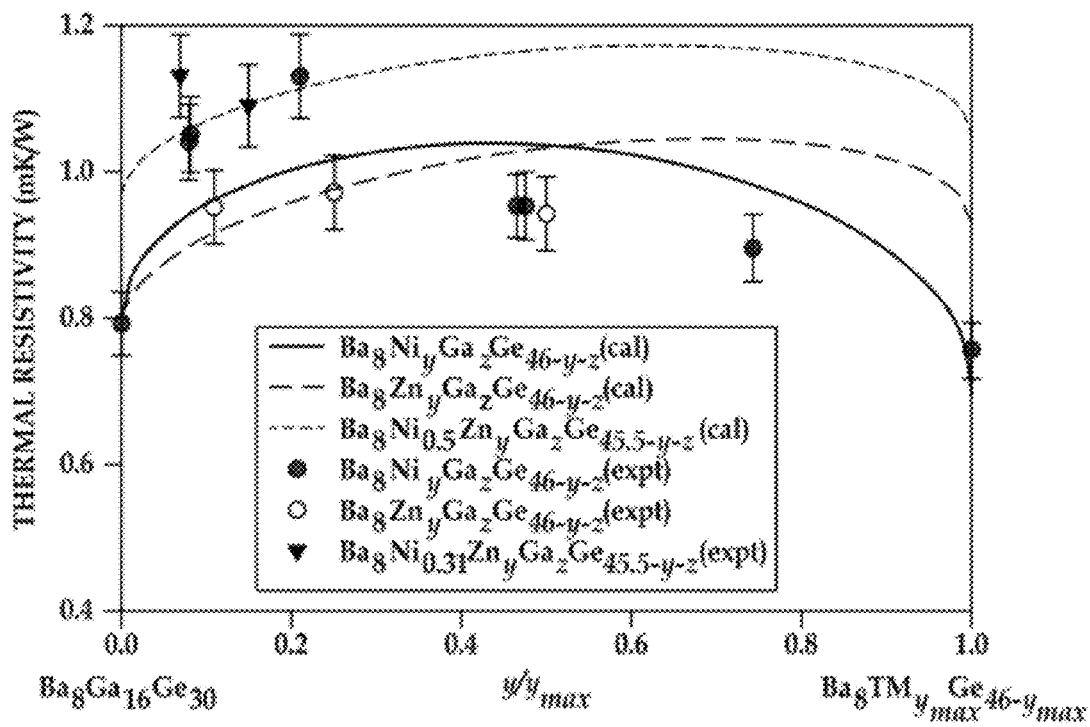
FIG. 8 is a graph depicting room temperature lattice thermal resistivity versus transition metal concentration in (TM)-doped $Ba_8 Ga_{16} Ge_{30}$ clathrates, where the lines are calculated results and the symbols are experimental data with error bars.

The calculated and experimental lattice thermal resistivity ($1/\kappa_L$) versus the transition metal concentration of some of the doped $Ba_8Ga_{16}Ge_{30}$ clathrates is shown in FIG. 8. The lines illustrate the calculated results and the symbols illustrate the experimental data. The results indicate that a significant decrease in $\kappa_L$ occurs upon transition metal doping. The experimental data shown in FIGS. 2-7 are consistent with the calculations and results shown in FIG. 8. The simultaneous doping with Ni and Zn illustrates an enhanced lattice thermal conductivity reduction. It is believed that the experimental data and calculations set forth herein may be used to predict the lattice thermal conductivity in transition metal-doped clathrates.

The enhanced $S^2\sigma$ and reduced $\kappa^L$ of the transition metal-doped clathrates improves Z and ZT, shown in FIGS. 7A and 7B, respectively. The key is shown in FIG. 7B, and the results include other sample clathrates formed in this example, including $Ba_8Ni_{0.31}Zn_{0.52}Ga_{13.06}Ge_{32.2}$. At least in part because of the additional lattice thermal conductivity reduction by simultaneously alloying Ni and Zn on the Ga site, the $Ba_8Ni_{0.31}Zn_{0.52}Ga_{13.06}Ge_{32.2}$ has ZT=1.2 at 1000 K. It is believed that this is the highest ZT ever reported for a polycrystalline sample.

While several embodiments have been described in detail, it will be apparent to those skilled in the art that the disclosed embodiments may be modified. Therefore, the foregoing description is to be considered exemplary rather than limiting.

The invention claimed is:

1. A thermoelectric material comprising a multiple transition metal-doped type I clathrate crystal structure having the formula $A_8TM^1_{y_1}TM''_{y_n}M_zX_{46-y_1-y_n-z}$, wherein:
   A is selected from the group consisting of barium, strontium, and europium;
   X is selected from the group consisting of silicon, germanium, and tin;
   M is selected from the group consisting of aluminum, gallium, and indium;
   $TM^1$ is selected from the group consisting of 3d, 4d, and 5d transition metals;
   $TM''$ is one or more transition metals selected from the group consisting of 3d, 4d, and 5d transition metals; and
   $y_1$, $y_n$ and Z are actual compositions of $TM^1$, $TM''$, and M, respectively, wherein the actual compositions are based upon nominal compositions derived from the following equation: $z = 8 \cdot q_A - |\Delta q_1|y_1 - |\Delta q_n|y_n$, wherein $q_A$ is a charge state of A, and wherein $\Delta q_1$ and $\Delta q_n$ are, respectively, the nominal charge state of the first and n-th TM.

2. The thermoelectric material as defined in claim 1 wherein $TM^1$ is nickel.

3. The thermoelectric material as defined in claim 1 wherein $TM''$ is zinc.

4. The thermoelectric material as defined in claim 1 wherein the thermoelectric material has an average thermoelectric figure of merit, ZT, of up to about 2.0 at a temperature ranging from about 500K to about 1000K.

5. The thermoelectric material as defined in claim 4 wherein $TM^1$ and $TM''$ alter at least one of i) a band gap of the type I clathrate crystal structure, or ii) a charge distribution of the type I clathrate crystal structure to achieve the thermoelectric figure of merit, ZT, of up to about 2.0 at a temperature ranging from about 500K to about 1000K.

6. The thermoelectric material as defined in claim 5 wherein the band gap ranges from about 0.1 eV to about 0.5 eV.

7. The thermoelectric material as defined in claim 1 wherein the type I clathrate structure has enhanced ionized impurity scattering as additional TM elements are added to the structure.

8. The thermoelectric material as defined in claim 1 wherein the type I clathrate structure has the formula $Ba_8Ni_{0.31}Zn_{0.52}Ga_{13.06}Ge_{32.2}$.

9. The thermoelectric material as defined in claim 8 wherein the type I clathrate structure having the formula $Ba_8Ni_{0.31}Zn_{0.52}Ga_{13.06}Ge_{32.2}$ has a thermoelectric figure of merit, ZT, of about 1.2.

10. The thermoelectric material as defined in claim 1 wherein the actual compositions are different than the nominal compositions due to at least one of vacancies or defects in the type I clathrate crystal structure.

11. A thermoelectric device, comprising:
    a substrate; and
    a material established on the substrate, the material including a multiple transition metal-doped type I clathrate crystal structure having the formula $A_8TM^1_{y_1}TM''_{y_n}M_zX_{46-y_1-y_n-z}$, wherein:
    X is selected from the group consisting of silicon, germanium, and tin;
    M is selected from the group consisting of aluminum, gallium, and indium;
    $TM^1$ is selected from the group consisting of 3d, 4d, and 5d transition metals;
    $TM''$ is one or more transition metals selected from the group consisting of 3d, 4d, and 5d transition metals; and
    $y_1$, $y_n$ and Z are actual compositions of $TM^1$, $TM''$, and M, respectively, wherein the actual compositions are based upon nominal compositions derived from the following equation: $z = 8 \cdot q_A - |\Delta q_1|y_1 - |\Delta q_n|y_n$, wherein $q_A$ is a charge state of A, and wherein $\Delta q_1$ and $\Delta q_n$ are, respectively, the nominal charge state of the first, and n-th TM.

12. The thermoelectric device as defined in claim 11 wherein the type I clathrate structure has the formula $Ba_8Ni_{0.31}Zn_{0.52}Ga_{13.06}Ge_{32.2}$.

13. The thermoelectric device as defined in claim 12 wherein the type I clathrate structure having the formula $Ba_8Ni_{0.31}Zn_{0.52}Ga_{13.06}Ge_{32.2}$ has a thermoelectric figure of merit, ZT, of about 1.2.

14. The thermoelectric device as defined in claim 11 wherein $TM^1$ and $TM^n$ alter at least one of i) a band gap of the type I clathrate crystal structure, or ii) a charge distribution of the type I clathrate crystal structure.

15. The thermoelectric device as defined in claim 14 wherein the type I clathrate structure achieves a thermoelectric figure of merit, ZT, of up to about 2.0 at a temperature ranging from about 500K to about 1000K.

16. The thermoelectric device as defined in claim 14 wherein the band gap ranges from about 0.1 eV to about 0.5 eV.

17. The thermoelectric device as defined in claim 11 wherein the type I clathrate structure has enhanced ionized impurity scattering as additional TM elements are added to the structure.

18. The thermoelectric device as defined in claim 11 wherein the device is a power generator.

19. A method for designing a thermoelectric material, comprising:
- determining compositions $y_1$, $y_n$ and Z for each variable component $TM^1$, $TM^n$, and M, of a multiple transition metal-doped type I clathrate crystal structure having the formula $A_8TM^1_{y_1}TM^n_{y_n}M_zX_{46-y_1-y_n-z}$, wherein: A is selected from the group consisting of barium, strontium, and europium; M is selected from the group consisting of aluminum, gallium, and indium; X is selected from the group consisting of silicon, germanium, and tin; $TM^1$ is selected from the group consisting of 3d, 4d, and 5d transition metals; and $TM^n$ is one or more transition metal selected from the group consisting of 3d, 4d, and 5d transition metals; the determining of the compositions $y_1$, $y_n$ and Z being based upon the formula $z=8 \cdot q_A - |\Delta q_1|y_1 - |\Delta q_n|y_n$, wherein $q_A$ is a charge state of A, and wherein $\Delta q_1$ and $\Delta q_n$ are, respectively, the nominal charge state of the first and n-th TM;
- from the determining, generating a nominal composition for the multiple transition metal-doped type I clathrate crystal structure; and
- preparing the transition metal-doped type I clathrate crystal structure according to the nominal composition.

20. The method as defined in claim 19, further comprising determining, via electron probe microanalysis, an actual composition of the prepared transition metal-doped type I clathrate crystal structure.

* * * * *